(12) United States Patent
Chern et al.

(10) Patent No.: US 12,078,554 B2
(45) Date of Patent: *Sep. 3, 2024

(54) TEMPERATURE PROTECTION CIRCUIT (71) Applicant: TAIWAN SEMICONDUCTOR MANUFACTURING COMPANY LIMITED, Hsin-Chu (TW)

(72) Inventors: Chan-Hong Chern, Palo Alto, CA (US); Kun-Lung Chen, Chu-pei (TW); Ming Hsien Tsai, New Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 344 days.

This patent is subject to a terminal disclaimer.

(21) Appl. No.: 17/402,796

(22) Filed: Aug. 16, 2021

(65) Prior Publication Data
US 2021/0372859 A1 Dec. 2, 2021

Related U.S. Application Data

(63) Continuation of application No. 16/458,585, filed on Jul. 1, 2019, now Pat. No. 11,092,497.
(Continued)

(51) Int. Cl.
*G01K 7/18* (2006.01)
*G01K 7/01* (2006.01)
(Continued)

(52) U.S. Cl.
CPC .............. *G01K 7/183* (2013.01); *G01K 7/015* (2013.01); *G01K 7/25* (2013.01); *G01R 1/203* (2013.01);
(Continued)

(58) Field of Classification Search
CPC .......... G01K 7/183; G01K 7/015; G01K 7/25; G01K 7/206; G01K 7/18; G01R 1/203; G01R 19/00; G01R 19/0092; G01R 27/02; G01R 27/08; G01R 27/14; H01L 2224/48227; H01L 2924/00; H01L 2924/0002; H01L 22/34; H03K 19/00369; H03K 19/20
See application file for complete search history.

(56) References Cited

U.S. PATENT DOCUMENTS 4,216,675 A 8/1980 Nagata et al.
7,161,396 B1 1/2007 Zhou et al.
(Continued)

FOREIGN PATENT DOCUMENTS

CN 2045132 U 9/1989
CN 1856838 A 11/2006
(Continued)

*Primary Examiner* — Raul J Rios Russo
(74) *Attorney, Agent, or Firm* — Cooper Legal Group, LLC (57) ABSTRACT

A circuit includes a temperature-sensitive voltage divider. The temperature-sensitive voltage divider includes a temperature-sensitive resistor and a second resistor having a first terminal coupled to a first terminal of the temperature-sensitive resistor. A temperature signal is generated at a first node coupled to the first terminal of the temperature-sensitive resistor. Detection logic is coupled to the first node to generate a detection signal responsive to the temperature signal.

20 Claims, 5 Drawing Sheets

Related U.S. Application Data (60) Provisional application No. 62/753,125, filed on Oct. 31, 2018.

(51) Int. Cl.
*G01K 7/25* (2006.01)
*G01R 1/20* (2006.01)
*G01R 19/00* (2006.01)
*G01R 27/02* (2006.01)
*G01R 27/08* (2006.01)
*G01R 27/14* (2006.01)
*H01L 21/66* (2006.01)

(52) U.S. Cl.
CPC .......... *G01R 19/00* (2013.01); *G01R 19/0092* (2013.01); *G01R 27/02* (2013.01); *G01R 27/08* (2013.01); *G01R 27/14* (2013.01); *H01L 22/34* (2013.01); *H01L 2224/48227* (2013.01); *H01L 2924/00* (2013.01); *H01L 2924/0002* (2013.01)

(56) References Cited

U.S. PATENT DOCUMENTS

| | | | |
|---|---|---|---|
| 2012/0016610 A1* | 1/2012 | Lan | G01K 7/24 702/65 |
| 2015/0109155 A1 | 4/2015 | Kon et al. | |
| 2015/0198486 A1* | 7/2015 | Mitsui | G01K 15/007 374/185 |
| 2015/0270254 A1* | 9/2015 | Risbud | H01L 27/0605 257/76 |
| 2018/0152140 A1 | 5/2018 | Chen et al. | |
| 2018/0294638 A1* | 10/2018 | Jiang | H02H 1/0007 |
| 2019/0051952 A1 | 2/2019 | Yano | |
| 2019/0103835 A1* | 4/2019 | Tsai | H03B 5/04 |
| 2019/0123550 A1 | 4/2019 | Hui et al. | |
| 2020/0132558 A1* | 4/2020 | Chern | G01R 1/203 |
| 2021/0055166 A1* | 2/2021 | Wang | G01K 7/021 |

FOREIGN PATENT DOCUMENTS

| | | |
|---|---|---|
| CN | 201043961 Y | 4/2008 |
| CN | 102288322 A | 12/2011 |
| CN | 102338670 A | 2/2012 |
| CN | 103165180 A | 6/2013 |
| CN | 104236735 A | 12/2014 |
| CN | 106575865 A | 4/2017 |
| CN | 206948294 U | 1/2018 |
| CN | 107658848 A | 2/2018 |
| JP | 2005274372 A | 10/2005 |
| JP | 2010193627 A | 9/2010 |
| TW | M391791 | 11/2010 |
| TW | 201404016 A | 1/2014 |
| TW | 201506367 A | 2/2015 |

* cited by examiner

TEMPERATURE PROTECTION CIRCUIT

RELATED APPLICATION

This application is a continuation of U.S. Non-Provisional application Ser. No. 16/458,585, titled "TEMPERATURE PROTECTION CIRCUIT" and filed on Jul. 1, 2019, which claims priority to U.S. Provisional Application Ser. No. 62/753,125, titled "CIRCUIT(S) HAVING TEMPERATURE SENSITIVE COMPONENT(S)" and filed on Oct. 31, 2018. U.S. Non-Provisional application Ser. No. 16/458,585 and U.S. Provisional Application Ser. No. 62/753,125 are incorporated herein by reference.

BACKGROUND

Semiconductor arrangements are used in a multitude of electronic devices, such as mobile phones, laptops, desktops, tablets, watches, gaming systems, and various other industrial, commercial, and consumer electronics. Semiconductor arrangements generally comprise active components and passive components. Active components comprise transistors, processors, and memory, while passive components are components, such as capacitors, resistors, etc. that affect an operation of an active component. Electronic devices are sensitive to heat. Heat sources include internal heat generated by the operation of active components and ambient heat transferred to the device by the environment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments described herein, temperature protection for a load is provided using a temperature-sensitive resistor. In some embodiments, the temperature-sensitive resistor is implemented in a voltage divider comprising at least one temperature-insensitive resistor to generate a temperature signal having a property, such as voltage, that is proportional or inversely proportional to the temperature of the load and associated devices, such as a temperature protection circuit. In some embodiments, detection logic detects if the property of the temperature signal reaches a level associated with an over-temperature condition and generates a detection signal indicating the over-temperature condition. A logic state of the detection signal indicates whether the detection logic has detected that the property of the temperature signal has reached a level associated with an over-temperature condition. In some embodiments, enable logic receives the detection signal and generates an enable signal that, depending upon the state of the detection signal, enables the load or disables the load to protect and enhance reliability of the devices in the load. In some embodiments, hysteresis is provided to reduce the likelihood of oscillation of the enable signal.

Figure 1:
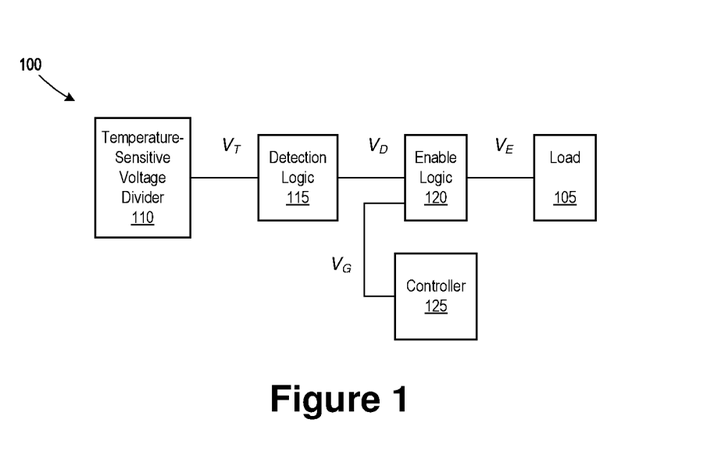
FIG. 1 is a diagram illustrating a circuit for providing temperature protection for a load, in accordance with some embodiments.

FIG. 1 is a diagram illustrating an example temperature protection circuit 100 for providing temperature protection to a load 105, in accordance with some embodiments. In some embodiments, the temperature protection circuit 100 comprises a temperature-sensitive voltage divider 110 coupled to detection logic 115 to detect a state of the temperature-sensitive voltage divider 110 with respect to a threshold temperature. In some embodiments, the detection logic 115 is coupled to enable logic 120 that generates an enable signal, $V_E$, for enabling or disabling the load 105. In some embodiments, a controller 125 is coupled to the enable logic 120 to generate a global enable signal, $V_G$, for enabling or disabling the load 105. In some embodiments, the temperature protection circuit 100 is embodied in a common semiconductor die or package, such that the temperature-sensitive voltage divider 110 is located proximate the load 105 to allow the temperature-sensitive voltage divider 110 to track a temperature of the load 105. According to some embodiments, the load 105 generates heat during operation. In general, heat generated by the load 105 is dissipated to the ambient environment or by an active or passing cooling system associated with a device comprising the load 105. In some embodiments, an over-temperature condition can be encountered if the heat generated by the load 105 is not sufficiently dissipated. In some embodiments, the temperature protection circuit 100 detects an over-temperature condition and a logic state of the enable signal, $V_E$, is changed from a state that enables the load to a state that disables the load 105. In some embodiments, disabling the load 105 removes the load 105 as a heat source and reduces the likelihood of temperature-related damage to the load 105 or other associated devices, for example.

In some embodiments, the temperature-sensitive voltage divider 110 generates a temperature signal, $V_T$, associated with or that is a function of a temperature of the load 105. The detection logic 115 determines if a property of the temperature signal, $V_T$, such as a voltage of the temperature signal, $V_T$, meets a threshold condition associated with load over-temperature. In some embodiments, the detection logic 115 generates a detection signal, $V_D$, indicating whether the temperature of the load 105, represented by the temperature signal, $V_T$, is above or below an over-temperature threshold, $T_C$. In some embodiments, the detection logic 115 is controllably gated by the temperature signal, $V_T$.

In some embodiments, the property of the temperature signal, $V_T$, is proportional to the temperature detected by the temperature-sensitive voltage divider 110. In some embodiments, when the property of the temperature signal, $V_T$, is proportional to the temperature detected by the temperature-sensitive voltage divider 110, the property of the temperature signal, $V_T$, generated by the temperature-sensitive voltage divider 110 increases with increases in temperature, and the detection logic 115 detects when the property of the temperature signal, $V_T$, exceeds the over-temperature threshold, $T_C$. In some embodiments, when the property of the temperature signal, $V_T$, is proportional to the temperature detected by the temperature-sensitive voltage divider 110, the property of the temperature signal, $V_T$, generated by the temperature-sensitive voltage divider 110 decreases with decreases in temperature, and the detection logic 115 detects when the property of the temperature signal, $V_T$, falls below the over-temperature threshold, $T_C$. In some embodiments, the detection logic 115 comprises an inverter configured to generate the detection signal, $V_D$, having a first logic state when the property of the temperature signal, $V_T$, is above the over-temperature threshold, $T_C$, indicating an over-temperature condition, and having a second, opposite logic state when the property of the temperature signal, $V_T$, is below the over-temperature threshold, $T_C$, indicating an acceptable temperature condition. In some embodiments, the detection logic 115 employs hysteresis around the over-temperature threshold, $T_C$, to increase stability.

In some embodiments, the property of the temperature signal, $V_T$, is inversely proportional to the temperature detected by the temperature-sensitive voltage divider 110. In some embodiments, when the property of the temperature signal, $V_T$, is inversely proportional to the temperature detected by the temperature-sensitive voltage divider 110, the property of the temperature signal, $V_T$, generated by the temperature-sensitive voltage divider 110 decreases with increases in temperature, and the detection logic 115 detects when the property of the temperature signal, $V_T$, falls below the over-temperature threshold, $T_C$. In some embodiments, when the property of the temperature signal, $V_T$, is inversely proportional to the temperature detected by the temperature-sensitive voltage divider 110, the property of the temperature signal, $V_T$, generated by the temperature-sensitive voltage divider 110 increases with decreases in temperature, and the detection logic 115 detects when the property of the temperature signal, $V_T$, exceeds the over-temperature threshold, $T_C$. In some embodiments, the detection logic 115 comprises a temperature-sensitive inverter configured to generate the detection signal, $V_D$, having the first logic state when the property of the temperature signal, $V_T$, is below the over-temperature threshold, $T_C$, indicating an over-temperature condition, and having the second, opposite logic state when the property of the temperature signal, $V_T$, is above the over-temperature threshold, $T_C$, indicating an acceptable temperature condition. In some embodiments, the detection logic 115 employs hysteresis around the over-temperature threshold, $T_C$, to increase stability.

In some embodiments, the enable logic 120 receives the detection signal, $V_D$, and generates an enable signal, $V_E$, for enabling or disabling the load 105. In some embodiments, the enable logic 120 receives the detection signal, $V_D$, and a global enable signal, $V_G$, from the controller 125 and generates the enable signal, $V_E$, for enabling or the load 105 when the global enable signal, $V_G$, has a logic state indicating that load is to be enabled and the detection signal, $V_D$, has a logic state indicating an acceptable temperature condition. In some embodiments, the controller 125 controls the global enable signal, $V_G$, to generate a periodic signal, such as a pulse width modulation (PWM) timing signal, that controls the load 105 to implement a power conversion activity to generate a radio frequency (RF) signal.

Figure 2:
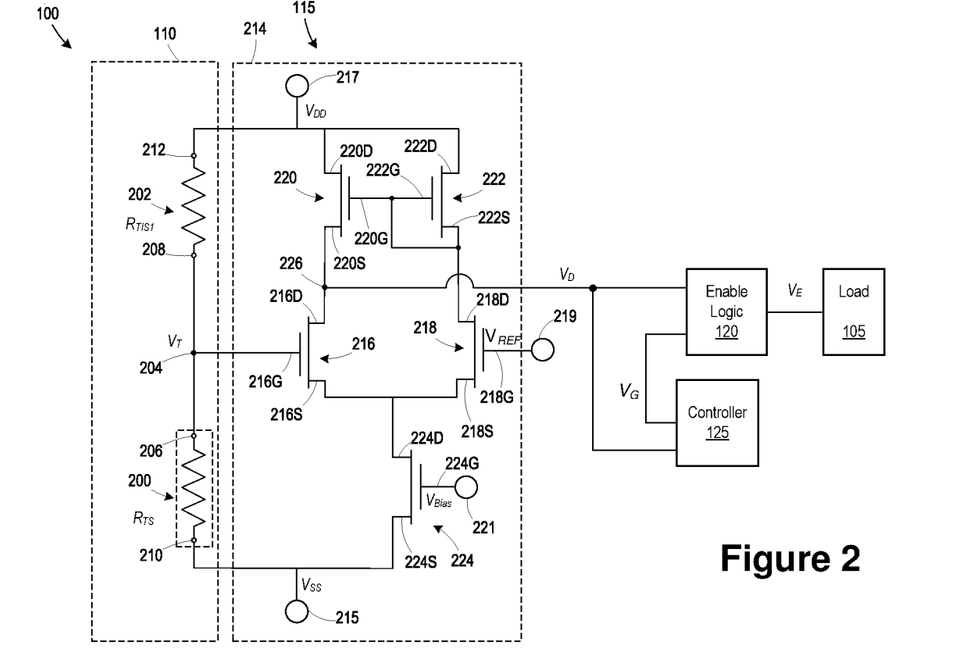
FIG. 2 is a diagram illustrating a temperature protection circuit, in accordance with some embodiments.

FIG. 2 is a circuit diagram illustrating a first embodiment of the temperature protection circuit 100, in accordance with some embodiments. In some embodiments, the temperature-sensitive voltage divider 110 comprises a first temperature-sensitive resistor 200 coupled to a second temperature-insensitive resistor 202. In some embodiments, the first temperature-sensitive resistor 200 exhibits a resistance, $R_{TS}$, that increases with temperature, T. In some embodiments, the second temperature-insensitive resistor 202 exhibits a resistance, $R_{TSI1}$, that is relatively temperature-insensitive due to the second temperature-insensitive resistor 202 having a temperature coefficient significantly less than that of the first temperature-sensitive resistor 200. In some embodiments, the temperature coefficient of the first temperature-sensitive resistor 200 is about 100-1000 part per million per degree Celsius (ppm/° C.), and the temperature coefficient of the second temperature-insensitive resistor 202 is about <10 ppm/° C. In some embodiments, the first temperature-sensitive resistor 200 comprises a gallium nitride (GaN) resistor exhibiting two-dimensional electron gas (2DEG) characteristics. In some embodiments, a GaN 2DEG resistor is similar to a depletion-mode GaN transistor without a gate connection. In some embodiments, the gate and source of the GaN transistor are shorted. In some embodiments, the second temperature-insensitive resistor 202 comprises at least one of silicon or chromium. In some embodiments, the second temperature-insensitive resistor 202 comprises a silicon chromium (SiCr) resistor.

According to some embodiments, a temperature sensing node 204 of the temperature-sensitive voltage divider 110 is defined between a first terminal 206 of the first temperature-sensitive resistor 200 and a first terminal 208 of the second temperature-insensitive resistor 202. In some embodiments, a second terminal 210 of the first temperature-sensitive resistor 200 is coupled to a first voltage source 215 applying a first voltage, $V_{SS}$, such as ground, and a second terminal 212 of the second temperature-insensitive resistor 202 is coupled to a second voltage source 217 applying a second voltage, $V_{DD}$. In some embodiments, the temperature signal, $V_T$, is generated at the temperature sensing node 204. In some embodiments, a voltage of the temperature signal, $V_T$, is given by:

$$V_T = V_{DD}^* \frac{R_{TS}(T)}{R_{TS}(T) + R_{TIS1}}. \quad (1)$$

As evident in Equation 1, the voltage of the temperature signal, $V_T$, is proportional to the temperature, (T). Since $R_{TS}$ increases with temperature, T, so too does the voltage of the temperature signal, $V_T$, increase with temperature, T.

According to some embodiments, various active devices, such as transistors, are illustrated. The transistors have source/drain regions. Generally, depending on how the transistor is oriented in a circuit and a direction of current flow, one of the source/drain regions operates as a drain and the other of the source/drain regions operates as a source. The term, "source/drain" refers generically to regions that may operate as a source or as a drain of the transistor. Moreover, while specific reference is made below to a drain and a source of a transistor, in some embodiments, the location of the drain and the source is reversed. That is, what is referenced below as a drain of a transistor may, in some embodiments, instead be the source of the transistor and what is referenced below as a source of the transistor may, in some embodiments, instead be the drain of the transistor.

In some embodiments, the detection logic 115 comprises an inverter. In some embodiments, the detection logic 115 comprises a differential amplifier 214 configured to operate as the inverter. In some embodiments, the differential amplifier 214 is controllably gated by the temperature signal, $V_T$. In some embodiments, the differential amplifier 214 comprises input transistors 216, 218, load transistors 220, 222, and a bias transistor 224. In some embodiments, at least one of the input transistors 216, 218, the load transistors 220, 222, or the bias transistor 224 comprises a gallium nitride high electron mobility transistor (GaN HEMT). In some embodiments, the GaN HEMT is an N-type device. In some embodiments, at least one of the input transistors 216, 218 or the bias transistor 224 comprises an enhancement mode transistor. In some embodiments, the load transistors 220, 220 comprise depletion mode transistors.

In some embodiments, a gate 216G of the input transistor 216 is coupled to the temperature sensing node 204. In some embodiments, a gate 218G of the input transistor 218 is coupled to a reference voltage source 219 applying a reference voltage, $V_{REF}$. In some embodiments, a drain 216D of the input transistor 216 is coupled to a source 220S of the load transistor 220, and a drain 218D of the input transistor 218 is coupled to a source 222S of the load transistor 222.

In some embodiments, a gate 220G of the load transistor 220 is coupled to a gate 222G of the load transistor 222, and the gates 220G, 222G of the load transistors 220, 222 are coupled to the source 222S of the load transistor 222 to configure the load transistor 220 and the load transistor 222 as a current mirror.

In some embodiments, a drain 220D of the load transistor 220, and a drain 222D of the load transistor 222 are coupled to the second voltage source 217. In some embodiments, a source 216S of the input transistor 216 and a source 218S of the input transistor 218 are coupled to a drain 224D of the bias transistor 224. In some embodiments, a gate 224G of the bias transistor 224 is coupled to a bias voltage source 221 applying a bias voltage, $V_{Bias}$. In some embodiments, a source 224S of the bias transistor 224 is coupled to the first voltage source 215. In some embodiments, an output of the differential amplifier 214, the detection signal, $V_D$, is generated at a node 226 defined by the drain 216D of the input transistor 216 and the source 220S of the load transistor 220.

In some embodiments, the detection signal, $V_D$, output by the differential amplifier 214 changes logic states when the voltage of the temperature signal, $V_T$, exceeds the reference voltage, $V_{REF}$. According to some embodiments, the reference voltage, $V_{REF}$, is selected to determine the over-temperature threshold, $T_C$, at which the detection logic 115 detects the over-temperature condition of the load 105. In some embodiments, when the voltage of the temperature signal, $V_T$, is less than the reference voltage, $V_{REF}$, by a first margin, the input transistor 218 and the load transistor 222 saturate and carry the current of the differential amplifier 214, and a voltage of the detection signal, $V_D$, is near the second voltage, $V_{DD}$, representing a first logic state, such as logic "1". In some embodiments, when the voltage of the temperature signal, $V_T$, exceeds the reference voltage, $V_{REF}$, by a second margin, the input transistor 216 and the load transistor 220 saturate and carry the current of the differential amplifier 214, and the voltage of the detection signal, $V_D$, is near the first voltage, $V_{SS}$, representing a second logic state, such as logic "0".

In some embodiments, a region between the saturated states at the first margin and the second margin represents a linear operating region of the differential amplifier 214, where the differential amplifier 214 tracks a difference between the reference voltage, $V_{REF}$, and the temperature signal, $V_T$. The tracked difference increases until the differential amplifier 214 saturates the input transistor 218 and the load transistor 222 or the input transistor 216 and the load transistor 220. In some embodiments, this linear operating region provides a small hysteresis zone between a switch of the detection signal, $V_D$, from the first logic state to the second logic state and a switch of the detection signal, $V_D$, from the second logic state to the first logic state In some embodiments, the enable logic 120 comprises a logic gate, such as an AND gate, NOR gate, etc., that determines a logic state of the enable signal, $V_E$, based on the global enable signal, $V_G$, and detection signal, $V_D$. For example, in some embodiments where the enable logic 120 comprises an AND gate, the enable logic 120 may cause the enable signal, $V_E$, to have a first logic state, such as logic "1", that enables the load 105 responsive to the global enable signal, $V_G$, and the detection signal, $V_D$, each having a first logic state, such as logic "1". In response to the detection signal, $V_D$, switching to a second logic state, such as logic "0", representing an over-temperature condition, the enable logic 120 may cause the enable signal, $V_E$, to have a second logic state, such as logic "0", that causes power or signal input to be removed from the load 105 or otherwise disables the load 105, according to some embodiments. In some embodiments, the enable logic 120 may also cause the enable signal, $V_E$, to have the second logic state, such as logic "0", responsive the global enable signal, $V_G$, being switched to a second logic state, such as logic "0", by the controller 125.

According to some embodiments, the load 105 generates heat during operation. If active or passive heat dissipation provided to the load 105 and associated devices is not sufficient, a temperature of the temperature protection circuit 100 increases. In some embodiments, as the temperature increases, the resistance of the first temperature-sensitive resistor 200 increases and the voltage of the temperature signal, $V_T$, generated by the temperature-sensitive voltage divider 110 increases. In some embodiments, the detection signal, $V_D$, generated by the differential amplifier 214 transitions from a first logic state, such as logic "1", to a second logic state, such as logic "0", responsive to the voltage of the temperature signal, $V_T$, exceeding the reference voltage, $V_{REF}$, representing an over-temperature condition. In some embodiments, the enable logic 120 may cause the enable signal, $V_E$, to have the second logic state, such as logic "0", that causes power or signal input to be removed from the load 105 or otherwise disables the load 105 responsive to the detection signal, $V_D$, having the second logic state, such as logic "0".

In some embodiments, the disabling of the load 105 removes the active heat source, allowing the load 105 and the associated devices to cool. In some embodiments, as the temperature of the temperature protection circuit 100 decreases, the resistance of the first temperature-sensitive resistor 200 decreases and the voltage of the temperature signal, $V_T$, generated by the temperature-sensitive voltage divider 110 decreases. In some embodiments, when the voltage of the temperature signal, $V_T$, falls below the reference voltage, $V_{REF}$, by the first margin, the detection signal, $V_D$, output by the differential amplifier 214 returns to the first logic state, such as logic "1", resulting in the enable logic 120 causing the enable signal, $V_E$, to have the first logic state, such as logic "1", that causes power or signal input to be applied to the load 105 or otherwise enables the load 105.

In some embodiments, the differential amplifier 214 described above with voltage offset between the gates of the input transistors 216, 218 may provide a small hysteresis that reduces the likelihood of oscillation around the over-temperature threshold, $T_C$, due to threshold voltage difference between the input transistor 216 and the input transistor 218. In some embodiments, to further reduce the likelihood of oscillation around the over-temperature threshold, $T_C$, the controller 125 detects a change in the logic state of the detection signal, $V_D$, from the first logic state, such as logic "1", that enables the load 105 to the second logic state, such as logic "0", that disables the load 105 and changes a logic state of the global enable signal, $V_G$, to a logic state that causes the enable logic 120 to maintain the enable signal, $V_E$, in the second logic state, such as logic "0" for a predetermined time interval after the change of the detection signal, $V_D$, from the first logic state, such as logic "1", to the second logic state, such as logic "0" to allow the load 105 and the associated devices to cool, even if the logic state of the detection signal, $V_D$, returns to the first logic state, such as logic "1", which would cause the enable logic 120 to enable the load 105 if not for the global enable signal, $V_G$, causing the enable logic 120 to maintain the enable signal, $V_E$, in the second logic state, such as logic "0" during the predetermined time interval.

Table 1 illustrates voltage and logic states for the temperature protection circuit 100 of FIG. 2, in accordance with some embodiments.

TABLE 1

Voltage and Logic States for Temperature Protection Circuit

| Temperature | Voltage of $V_T$ | Logic state of $V_D$ | Logic state of $V_G$ | Logic State of $V_E$ (Load) |
|---|---|---|---|---|
| T ↑ | ↑ | 1 | 1 | 1 (On) |
| T > $T_C$ | ↑ | 0 | 1 | 0 (Off) |
| T < $T_C$ | ↑ | 1 | 1 | 1 (On) |

In some embodiments, the positions of the first temperature-sensitive resistor 200 and the second temperature-insensitive resistor 202 are reversed to provide a voltage of the temperature signal, $V_T$, that is inversely proportional to temperature. In some embodiments, where the voltage of the temperature signal, $V_T$, is inversely proportional to temperature, the detection logic 115 is adjusted to account for the inverse relationship. Moreover, in some embodiments, the first logic state corresponds to a logic "0" and the second logic state corresponds to a logic "1" state when the voltage of the temperature signal, $V_T$, is inversely proportional to temperature.

Figure 3:
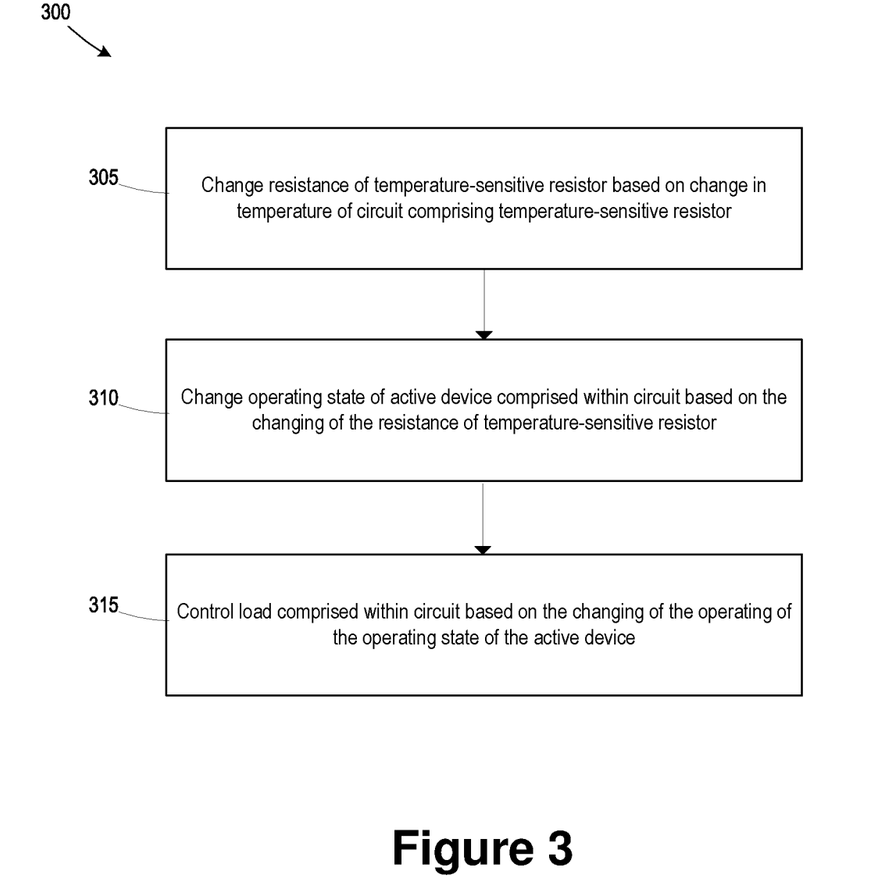
FIG. 3 is a flow diagram illustrating a method for providing temperature protection for a load, in accordance with some embodiments.

Referring to FIG. 3, a flow diagram of a method 300 providing temperature protection for a load 105 is illustrated, according to some embodiments. In some embodiments, a resistance of a first temperature-sensitive resistor 200 is changed based on a change in temperature of a temperature protection circuit 100 comprising the first temperature-sensitive resistor 200 at 305. In some embodiments, an operating state of an active device, such as the detection logic 115 or the differential amplifier 214 within the temperature protection circuit 100 is changed based on the change in the resistance of the first temperature-sensitive resistor 200 at 310. In some embodiments, the active device comprises an inverter. In some embodiments, the active device comprises the detection logic 115. In some embodiments, the active device comprises the differential amplifier 214. In some embodiments, the change in operating state comprises a change in a logic state of a signal output by the active device. In some embodiments, the change in logic state comprises a change from a first logic state, such as logic "1", to a second logic state, such as logic "0". In some embodiments, a load 105 in the temperature protection circuit 100 is controlled based on the change in the operating state of the active device at 315.

Figure 4:
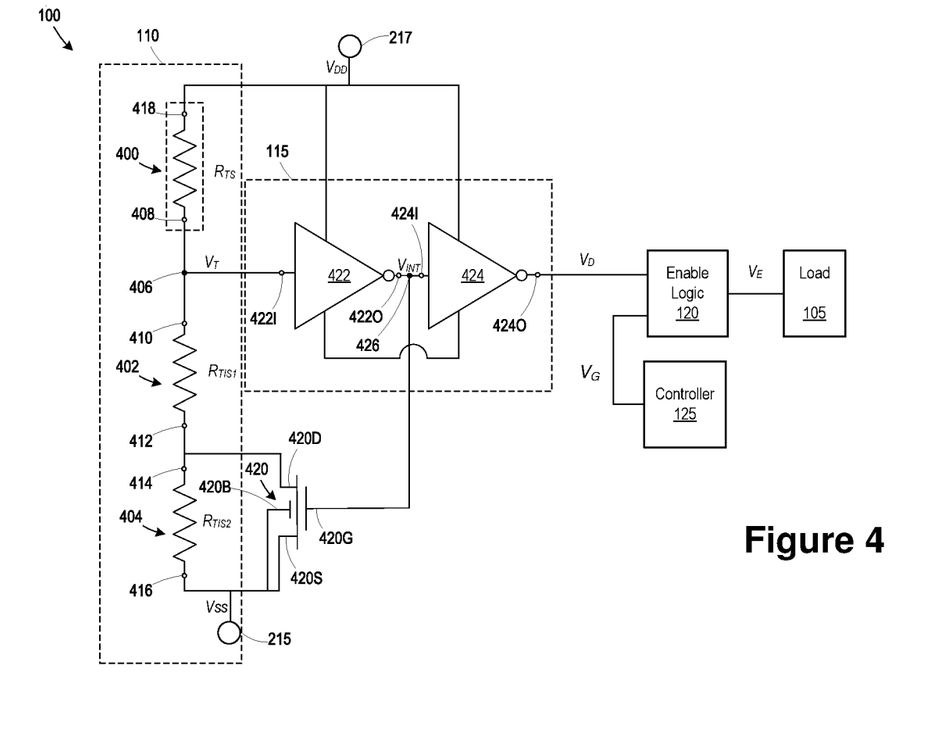
FIG. 4 is a circuit diagram illustrating a temperature protection circuit, in accordance with some embodiments.

FIG. 4 is a circuit diagram illustrating an embodiment of the temperature protection circuit 100, in accordance with some embodiments. In some embodiments, the temperature-sensitive voltage divider 110 comprises a first temperature-sensitive resistor 400 coupled to a second temperature-insensitive resistor 402 and a third temperature-insensitive resistor 404. In some embodiments, the first temperature-sensitive resistor 400 exhibits a resistance, $R_{TS}$, that increases with temperature, T. In some embodiments, the second temperature-insensitive resistor 402 exhibits a resistance, $R_{TIS1}$, and the third temperature-insensitive resistor 404 exhibits a resistance, $R_{TIS2}$, that are relatively temperature-insensitive due to the second temperature-insensitive resistor 402 and the third temperature-insensitive resistor 404 having temperature coefficients significantly less than that of the first temperature-sensitive resistor 400. In some embodiments, the temperature coefficient of the first temperature-sensitive resistor 400 is about 100-1000 ppm/° C., and the temperature coefficient of the second temperature-insensitive resistor 402 and the third temperature-insensitive resistor 404 are about <10 ppm/° C. In some embodiments, the first temperature-sensitive resistor 400 comprises a gallium nitride (GaN) resistor exhibiting two-dimensional electron gas (2DEG) characteristics. In some embodiments, at least one of the second temperature-insensitive resistor 402 or the third temperature-insensitive resistor 404 comprise at least one of silicon or chromium. In some embodiments, at least one of the second temperature-insensitive resistor 402 or the third temperature-insensitive resistor 404 comprises a silicon chromium (SiCr) resistor.

According to some embodiments, a temperature sensing node 406 of the temperature-sensitive voltage divider 110 is defined between a first terminal 408 of the first temperature-sensitive resistor 400 and a first terminal 410 of the second temperature-insensitive resistor 402. In some embodiments, a second terminal 412 of the second temperature-insensitive resistor 402 is coupled to a first terminal 414 of the third temperature-insensitive resistor 404. In some embodiments, a second terminal 416 of the third temperature-insensitive resistor 404 is coupled to a first voltage source 215 applying a first voltage, $V_{SS}$, and a second terminal 418 of the first temperature-sensitive resistor 400 is coupled to a second voltage source 217 applying a second voltage, $V_{DD}$. In some embodiments, the temperature signal, $V_T$, is generated at the temperature sensing node 406.

In some embodiments, a shunting transistor 420 is coupled across, or in parallel with, the third temperature-insensitive resistor 404 to allow changing the total resistance of the temperature-sensitive voltage divider 110 to selectively introduce hysteresis. In some embodiments, a drain 420D of the shunting transistor 420 is coupled to the second terminal 412 of the second temperature-insensitive resistor 402 and to the first terminal 414 of the third temperature-insensitive resistor 404. In some embodiments, a source 420S of the shunting transistor 420 is coupled to the first voltage source 215. In some embodiments, a body 420B of the shunting transistor 420 is coupled to the first voltage source 215. In some embodiments, the shunting transistor 420 comprises a GaN HEMT. In some embodiments, the shunting transistor 420 comprises an N-type device. In some embodiments, the shunting transistor 420 comprises an enhancement mode transistor.

According to some embodiments, the detection logic 115 comprises a first inverter 422 coupled to a second inverter 424. In some embodiments, the first inverter 422 is controllably gated by the temperature signal, $V_T$. In some embodiments, an input terminal 422I of the first inverter 422 is coupled to the temperature sensing node 406. In some embodiments, an intermediate node 426 is defined between an output terminal 422O of the first inverter 422 and an input terminal 424I of the second inverter 424. In some embodiments, an output terminal 424O of the second inverter 424 is coupled to the enable logic 120. In some embodiments, the intermediate node 426 is coupled to a gate 420G of the shunting transistor 420 to enable the shunting transistor 420 to provide a hysteresis. In some embodiments, the first inverter 422 logically inverts a logic state of the temperature signal, $V_T$, thereby logically inverting a signal generated at the first terminal 408 of the first temperature-sensitive resistor 400, to generate an inverted signal that is applied to a gate of an active device, such as the shunting transistor 420.

According to some embodiments, the temperature-sensitive voltage divider 110 has two configurations, depending on the operational state of the shunting transistor 420. In some embodiments, the temperature protection circuit 100 is in a low-temperature state prior to the load 105 being enabled. In a low-temperature state, a voltage of the temperature signal, $V_T$, is at a high level relative to an activation threshold of the first inverter 422, so the first inverter 422 detects that the temperature signal, $V_T$, has a first logic state, such as logic "1", at the input terminal 422I and outputs an intermediate control signal, $V_{INT}$, having a second logic state, such as logic "0", at the output terminal 422O, according to some embodiments. In some embodiments, the second inverter 424 detects that the intermediate control signal, $V_{INT}$, has the second logic state and outputs detection signal, $V_D$, having a first logic state, such as logic "1", at the output terminal 424O.

In some embodiments, the enable logic 120 enables or disables the load 105 based on the detection signal, $V_D$, and the global enable signal, $V_G$. In some embodiments, the enable logic 120 comprises an AND gate that causes the enable signal, $V_E$, to have a first logic state, such as logic "1", that enables the load 105 responsive to the detection signal, $V_D$, and a global enable signal, $V_G$, output by a controller 125 having the first logic state. In some embodiments, in response to the detection signal, $V_D$, having a second logic state, such as logic "0", representing an over-temperature condition, the enable logic 120 causes the enable signal, $V_E$, to have a second logic state, such as logic "0", that disables the load 105, such as by removing power from the load 105 or disabling signal input to the load 105, according to some embodiments. In some embodiments, the enable logic 120 also causes the enable signal, $V_E$, to have the second logic state responsive the global enable signal, $V_G$, having a second logic state, such as logic "0".

In some embodiments, the intermediate control signal, $V_{INT}$, is applied to the gate 420G of the shunting transistor 420. In some embodiments, when the intermediate control signal, $V_{INT}$, has the second logic state, such as logic "0", the shunt transistor 420 is disabled. In some embodiments, an operating mode of the temperature-sensitive voltage divider 110 with the shunting transistor 420 disabled is referred to as a heating mode, and an operating mode of the temperature-sensitive voltage divider 110 with the shunting transistor 420 enabled is referred to as a cooling mode.

Figure 5:
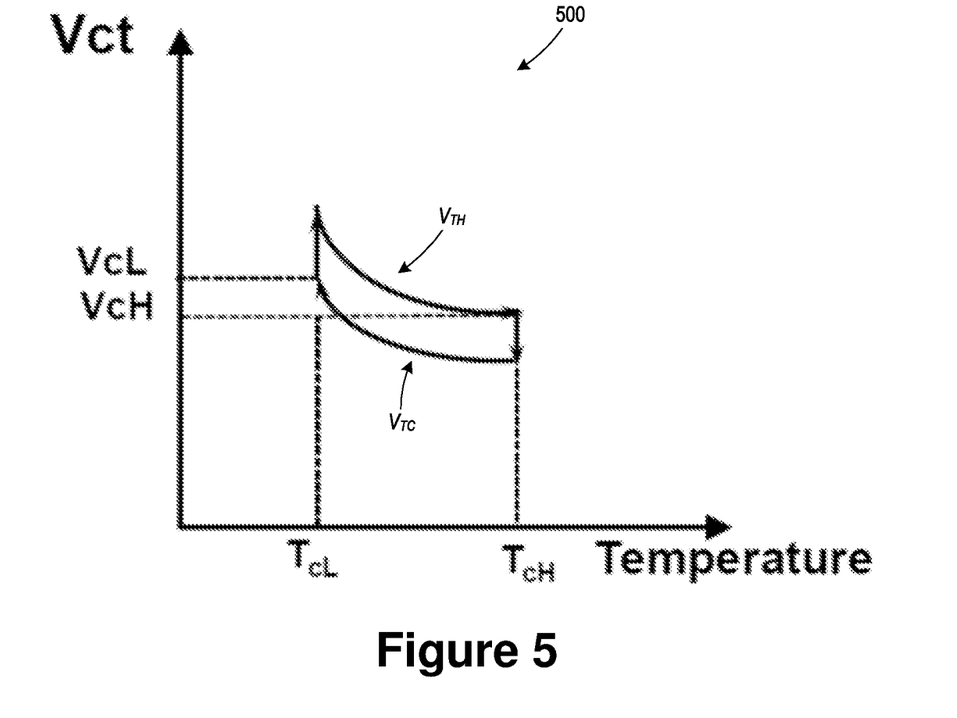
FIG. 5 is a diagram of a hysteresis curve for a temperature-sensitive voltage divider and a temperature protection circuit, in accordance with some embodiments.

FIG. 5 is a diagram of a hysteresis curve 500 for the temperature-sensitive voltage divider 110 and the temperature protection circuit 100, according to some embodiments. In some embodiments, the hysteresis curve 500 represents the activation threshold of the first inverter 422, the intermediate control signal, $V_{INT}$, of which has first logic state, such as logic "1", in an over-temperature condition when the temperature reaches an over-temperature threshold, $T_{cH}$, and has a second logic state, such as logic "0", in an acceptable temperature condition when the temperature falls below a re-enable temperature threshold, $T_{cL}$.

In some embodiments, the voltage, $V_{TH}$, of the temperature signal, $V_T$, in the heating mode, when the shunting transistor 420 is disabled, is given by:

$$V_T(\text{heating}) = V_{DD}^* \frac{R_{TIS1} + R_{TIS2}}{R_{TS}(T) + R_{TIS1} + R_{TIS2}}. \tag{2}$$

In some embodiments, the voltage, $V_{TC}$, of the temperature signal, $V_T$, in the cooling mode, when the shunting transistor 420 is enabled, is given by:

$$V_T(\text{cooling}) = V_{DD}^* \frac{R_{TIS1}}{R_{TS}(T) + R_{TIS1}}. \tag{3}$$

As evident in Equation 2 and 3, the temperature signal, $V_T$, is inversely proportional to the temperature, T. As $R_{TS}$ increases with temperature, T, the voltage of the temperature signal, $V_T$, decreases.

According to some embodiments, the load 105 generates heat during operation. If active or passive heat dissipation provided to the load 105 and associated devices is not sufficient, a temperature seen by the temperature protection circuit 100 increases. In some embodiments, considering an initial state in which the shunting transistor 420 is disabled, as the temperature increases, the resistance of the first temperature-sensitive resistor 400 increases and the output of the temperature-sensitive voltage divider 110 increases according to the temperature signal, $V_T$(heating), described in the configuration associated with Equation 2. As the temperature seen by the temperature protection circuit 100 continues to increase and reaches the over-temperature threshold, $T_{cH}$, the intermediate control signal, $V_{INT}$, that is output from first inverter 422 transitions to the first logic state, such as logic "1", resulting in the detection signal, $V_D$, that is output by the second inverter 424 transitioning from the first logic state, such as logic "1" to a second logic state, such as logic "0". In some embodiments, the enable logic 120 causes the enable signal, $V_E$, to have a second logic state, such as logic "0", that disables the load 105 responsive to the detection signal, $V_D$, changing from the first logic state, such as logic "1", to the second logic state, such as logic "0".

The disabling of the load 105 removes the active heat source, allowing the load 105 and the associated devices to cool. According to some embodiments, the intermediate control signal, $V_{INT}$, switches from the second logic state, such as logic "0", to the first logic state, such as logic "1", responsive to the detection of the over-temperature condition, which enables the shunting transistor 420 and transitions the configuration of the temperature-sensitive voltage divider 110 to the cooling mode, described with respect to Equation 3.

As the temperature of the temperature protection circuit 100 decreases, the resistance of the first temperature-sensitive resistor 400 decreases and the voltage of the temperature signal, $V_T$, generated by the temperature-sensitive voltage divider 110 increases. When the voltage of the temperature signal, $V_T$, reaches the re-enable temperature threshold, $T_{cL}$, representing an acceptable temperature condition, the intermediate control signal, $V_{INT}$, that is output from the first inverter 422 returns to the second logic state, such as logic "0", according to some embodiments. In some embodiments, the detection signal, $V_D$, that is output from the second inverter 424 returns to the first logic state, such as a logic "1", responsive to the intermediate control signal, $V_{INT}$, that is output from the first inverter 422 returning to the second logic state, such as logic "0". The enable logic 120 detects that the detection signal, $V_D$, has switched from the second logic state, such as logic "0", to the first logic state, such as logic "1", and switches a logic state of the enable signal, $V_E$, from the second logic state, such as logic "0", to the first logic state, such as logic "1", to allow operation of the load 105. In some embodiments, the shunting transistor 420 is disabled responsive to the intermediate control signal, $V_{INT}$, having the second logic state, such as logic "0", returning the configuration of the temperature-sensitive voltage divider 110 to the heating mode, described with respect to Equation 2.

According to some embodiments, the difference between the over-temperature threshold, $T_{cH}$, that activates the first inverter 422 to signal the over-temperature condition and the re-enable temperature threshold, $T_{cL}$, that resets the first inverter 422 represents a hysteresis that reduces the likelihood of oscillation in the enable signal, $V_E$.

In some embodiments, the positions of the first temperature-sensitive resistor 400 and the resistor pair comprising the second temperature-insensitive resistor 402 and the third temperature-insensitive resistor 404 are reversed to provide a temperature signal, $V_T$, proportional to temperature. In some embodiments, where the voltage of the temperature signal, $V_T$, is proportional to temperature, the detection logic 115 is adjusted to account for the proportion relationship. Moreover, in some embodiment, the first logic state corresponds to a logic "0" and the second logic state corresponds to a logic "1" where the voltage of the temperature signal, $V_T$, is proportional to temperature.

Figure 6:
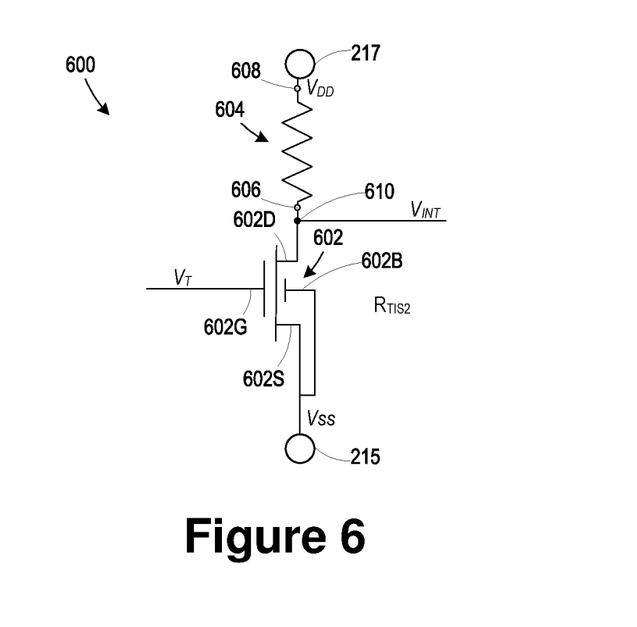
FIG. 6 is a circuit diagram of a temperature-sensitive inverter, in accordance with some embodiments.

FIG. 6 is a circuit diagram of an inverter 600, in accordance with some embodiments. In some embodiments, the inverter 600 is used to implement at least one of the first inverter 422 or the second inverter 424. For purposes of illustration, the signals illustrated in FIG. 6 correspond to those provided to and generated by the first inverter 422. In some embodiments, the inverter 600 comprises a pull-down transistor 602 and a resistor 604. In some embodiments, the resistor 604 is a temperature insensitive pull-up load resistor. In some embodiments, a gate 602G of the pull-down transistor 602 is coupled to receive the temperature signal, $V_T$. In some embodiments, a drain 604D of the pull-down transistor 602 is coupled to a first terminal 606 of the resistor 604. In some embodiments, a source 602S of the pull-down transistor 602 is coupled to the first voltage source 215. In some embodiments, a body 602B of the pull-down transistor 602 is coupled to the first voltage source 215. In some embodiments, a second terminal 608 of the resistor 604 is coupled to the second voltage source 217. In some embodiments, an intermediate control signal, $V_{INT}$, of the inverter 600 is generated at a node 610 coupled to the first terminal 606 of the resistor 604 and the drain 602D of the pull-down transistor 602. In some embodiments, the pull-down transistor 602 comprises a GaN LV HEMT. In some embodiments, the pull-down transistor 602 comprises an N-type device. In some embodiments, the pull-down transistor 602 comprises an enhancement mode transistor. In some embodiments, the resistor 604 comprises at least one of silicon or chromium. In some embodiments, the resistor 604 comprises a silicon chromium (SiCr) resistor.

According to some embodiments, the voltage of the temperature signal, $V_T$, determines the operating state of the pull-down transistor 602. As described above in reference to FIGS. 4 and 5, the voltage of the temperature signal, $V_T$, decreases as the temperature, T, increases. In some embodiments, the temperature signal, $V_T$, activates the pull-down transistor 602 at low temperatures of the load 105. In some embodiments, when a voltage greater than a threshold voltage of the pull-down transistor 602 is present on the gate 602G, the pull-down transistor 602 connects the first terminal 606 of the resistor 604 to the first voltage source 215, causing the output signal, $V_{INT}$, to have a second logic state, such as logic "0". In some embodiments, as the temperature of the load 105 and associated devices increases, the voltage of the temperature signal, $V_T$, decreases until the voltage falls below the threshold voltage of the pull-down transistor 602, turning off the pull-down transistor 602. In some embodiments, when the pull-down transistor 602 is disabled, or turned off, the intermediate control signal, $V_{INT}$, transitions to a first logic state, such as the second voltage, $V_{DD}$, or logic "1".

Table 2 illustrates voltage and logic states for the temperature protection circuit 100 of FIG. 4, in accordance with some embodiments.

TABLE 2

Voltage and Logic States for Temperature Protection Circuit

| Temperature | Voltage of $V_T$ | Logic state of $V_{INT}$ | State of Shunting Transistor | Logic state of $V_D$ | Logic state of $V_G$ | Logic state of $V_E$ (Load) |
|---|---|---|---|---|---|---|
| T → $T_{cH}$ | ↓ | 0 | Off | 1 | 1 | 1 (On) |
| T = $T_{cH}$ | 0 | 1 | On | 0 | 1 | 0 (Off) |
| T > $T_{cH}$ | 0 | 1 | On | 0 | 1 | 0 (Off) |
| $T_{cL}$ ← $T_{cH}$ | ↑ | 1 | On | 0 | 1 | 0 (Off) |
| T = $T_{cL}$ | 1 | 0 | Off | 1 | 1 | 1 (On) |
| T < $T_{cL}$ | 1 | 0 | Off | 1 | 1 | 1 (On) |

According to some embodiments, the load 105 comprises high voltage devices. In some embodiments, the operating range of the load is between about 12V to 700V. In some embodiments, the load 105 comprises high voltage transistors and gate drivers used to generate high voltage signals, such as pulse width modulation (PWM) signals for power conversion or radio frequency (RF) signals. In some embodiments, the transistors in the load 105 comprise gallium nitride high voltage high electron mobility transistors (GaN HV HEMTs). In some embodiments, the operating range of the GaN HV HEMTs is between about 12V to 700V. In some embodiments, GaN HEMT transistors enable higher performance and smaller form factors in power conversion and RF applications compared to silicon-based transistors. As described herein, in some embodiments, the transistors employed in the temperature protection circuit 100 comprise GaN LV HEMTs, which are N-type devices, and first the temperature-sensitive resistors 200, 400 comprise GaN 2DEG resistors. In some embodiments, the high voltage and low voltage HEMTs and the first temperature-sensitive resistors 200, 400 are fabricated using the same process technology, allowing temperature protection to be provided on the same die as the load 105.

In some embodiments, a circuit includes a temperature-sensitive voltage divider. The temperature-sensitive voltage divider includes a temperature-sensitive resistor and a second resistor having a first terminal coupled to a first terminal of the temperature-sensitive resistor. A temperature signal is generated at a first node coupled to the first terminal of the temperature-sensitive resistor. Detection logic is coupled to the first node to generate a detection signal responsive to the temperature signal.

In some embodiments, a circuit includes a temperature-sensitive voltage divider. The temperature-sensitive voltage divider includes a temperature-sensitive resistor, a second resistor having a first terminal coupled to a first terminal of the temperature-sensitive resistor, and a third resistor having a first terminal coupled to a second terminal of the second resistor. An active device has a first source/drain coupled to the first terminal of the third resistor, a second source/drain coupled to a second terminal of the third resistor, and a gate coupled to a node between the first terminal of the temperature-sensitive resistor and the first terminal of the second resistor. A logic device is controllably gated based on a voltage at the node.

In some embodiments, a method includes changing a resistance of a temperature-sensitive resistor based on a change in temperature of a circuit comprising the temperature-sensitive resistor. An operating state of an active device within the circuit is changed based on changing of the resistance of the temperature-sensitive resistor. A load within the circuit is controlled based on changing of the operating state of the active device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A circuit, comprising:
   a temperature-sensitive voltage divider, comprising:

a temperature-sensitive resistor; and
a second resistor;
a first inverter commonly coupled to the temperature-sensitive resistor and the second resistor at a first node, wherein:
a temperature signal is generated at the first node, and the first inverter comprises:
a first transistor having a gate to which the temperature signal is applied; and
a third resistor coupled to a first source/drain of the first transistor at a second node, wherein a control signal is output from the first inverter at the second node.

2. The circuit of claim 1, comprising
a second inverter coupled to the second node, wherein the second inverter comprises:
a second transistor having a gate to which the control signal is applied; and
a fourth resistor coupled to a first source/drain of the second transistor at a third node, wherein a detection signal is output from the second inverter at the third node.

3. The circuit of claim 2, comprising:
enable logic coupled between the third node and a load.

4. The circuit of claim 1, comprising:
a second transistor, wherein a gate of the second transistor is coupled to second node.

5. The circuit of claim 4, wherein:
a first terminal of the second resistor is coupled to the temperature-sensitive resistor, and
a second terminal of the second resistor is coupled to a first source/drain of the second transistor.

6. The circuit of claim 5, comprising:
a fourth resistor, wherein:
a first terminal of the fourth resistor is coupled to the first source/drain of the second transistor, and
a second terminal of the fourth resistor is coupled to a second source/drain of the second transistor.

7. The circuit of claim 1, wherein the second resistor is a temperature-insensitive resistor.

8. The circuit of claim 4, wherein the gate of the second transistor is directly coupled to second node.

9. A circuit, comprising:
a temperature-sensitive resistor; and
detection logic comprising:
a first transistor having a gate coupled to a first terminal of the temperature-sensitive resistor; and
a second transistor having a first source/drain coupled to a first source/drain of the first transistor and a second source/drain coupled to a second terminal of the temperature-sensitive resistor.

10. The circuit of claim 9, comprising:
a second resistor coupled to the first terminal of the temperature-sensitive resistor.

11. The circuit of claim 10, wherein a first terminal of the second resistor, the first terminal of the temperature-sensitive resistor, and the gate of the first transistor are commonly coupled.

12. The circuit of claim 10, comprising:
a third transistor, wherein:
a first source/drain of the third transistor is coupled to a second source/drain of the second transistor, and
a second source/drain of the third transistor is coupled to a second terminal of the second resistor.

13. The circuit of claim 10, wherein the second resistor is a temperature-insensitive resistor.

14. The circuit of claim 9, wherein the second terminal of the temperature-sensitive resistor is coupled to ground.

15. The circuit of claim 9, wherein the detection logic comprises a third transistor having a first source/drain coupled to the first source/drain of the first transistor and a gate coupled to a reference voltage source.

16. A circuit, comprising:
a temperature-sensitive voltage divider, comprising:
a temperature-sensitive resistor; and
a second resistor;
a first inverter having an input terminal coupled to a first terminal of the temperature-sensitive resistor; and
a shunting transistor having a gate coupled to an output terminal of the first inverter and a first source/drain coupled to a first terminal of the second resistor.

17. The circuit of claim 16, comprising a second inverter having an input terminal coupled to the output terminal of the first inverter.

18. The circuit of claim 16, wherein the shunting transistor has a second source/drain coupled to a second terminal of the second resistor.

19. The circuit of claim 16, wherein the shunting transistor has a body coupled to a second terminal of the second resistor.

20. The circuit of claim 16, wherein the second resistor is a temperature-insensitive resistor.

* * * * *